US011101130B2

(12) United States Patent
Clarke et al.

(10) Patent No.: US 11,101,130 B2
(45) Date of Patent: Aug. 24, 2021

(54) METHOD OF FILLING GROOVES AND HOLES IN A SUBSTRATE

(71) Applicant: Raytheon Company, Waltham, MA (US)

(72) Inventors: Andrew Clarke, Santa Barbara, CA (US); Robert M. Emerson, Solvang, CA (US); George Grama, Orcutt, CA (US); June-Marie Boll, Lompoc, CA (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 16/570,408

(22) Filed: Sep. 13, 2019

(65) Prior Publication Data

US 2020/0211846 A1   Jul. 2, 2020

Related U.S. Application Data

(60) Provisional application No. 62/785,653, filed on Dec. 27, 2018.

(51) Int. Cl.
*H01L 21/02* (2006.01)
*H01L 21/768* (2006.01)

(52) U.S. Cl.
CPC .. *H01L 21/02697* (2013.01); *H01L 21/76838* (2013.01); *H01L 21/76882* (2013.01); *H01L 21/76883* (2013.01); *H01L 21/76886* (2013.01)

(58) Field of Classification Search
CPC ......... H01L 21/02697; H01L 21/76838; H01L 21/76858; H01L 21/76853;
(Continued)

(56) References Cited

U.S. PATENT DOCUMENTS 5,234,153 A   8/1993   Bacon et al.
5,611,481 A   3/1997   Akamatsu et al.
(Continued)

FOREIGN PATENT DOCUMENTS

EP   1065713 A2   1/2001
EP   1720204 A1   11/2006

OTHER PUBLICATIONS

International Search Report and Written Opinion from related PCT Application No. PCT/US2019/054086, dated Nov. 27, 2019.

*Primary Examiner* — Zandra V Smith
*Assistant Examiner* — Abbigale A Boyle
(74) *Attorney, Agent, or Firm* — Burns & Levinson, LLP; Joseph M. Maraia

(57) ABSTRACT

A method of forming a pattern of metallic material on a substrate includes providing a plurality of void regions on a surface of the substrate. At a first temperature, a first layer of a first metallic material of a eutectic-forming pair of metallic materials is deposited on the substrate to form a conformal metallic film over the substrate and over the surfaces of the plurality of void regions. The substrate and conformal metallic film are warmed to a second temperature greater than a eutectic-liquid-formation temperature of the eutectic pair of metallic materials. At the second temperature, the second metallic material of the eutectic-forming pair of metallic materials is deposited on the conformal metallic film to initiate a eutectic-liquid-forming reaction, such that the plurality of void regions are filled with a mixture of the first and second metallic materials of the eutectic-forming pair of metallic materials.

25 Claims, 13 Drawing Sheets

Filling By Liquid-Solid Fluid

(58) Field of Classification Search
CPC ......... H01L 21/76855; H01L 21/76877; H01L 21/76883; H01L 21/76886
See application file for complete search history.

(56) References Cited

U.S. PATENT DOCUMENTS

| | | | |
|---|---|---|---|
| 6,093,968 A * | 7/2000 | Honeycutt | H01L 21/76882 257/751 |
| 6,550,665 B1 | 4/2003 | Parrish et al. | |
| 6,602,788 B2 * | 8/2003 | Burke | H01L 21/2855 257/E21.169 |
| 6,780,772 B2 * | 8/2004 | Uzoh | C25F 3/14 205/123 |
| 7,410,825 B2 * | 8/2008 | Majumdar | H01G 11/48 438/106 |
| 9,412,658 B2 * | 8/2016 | Gluschenkov | H01L 21/76894 |
| 9,947,809 B2 * | 4/2018 | Kim | B23K 35/0261 |
| 2010/0244159 A1 | 9/2010 | Karlin et al. | |

\* cited by examiner

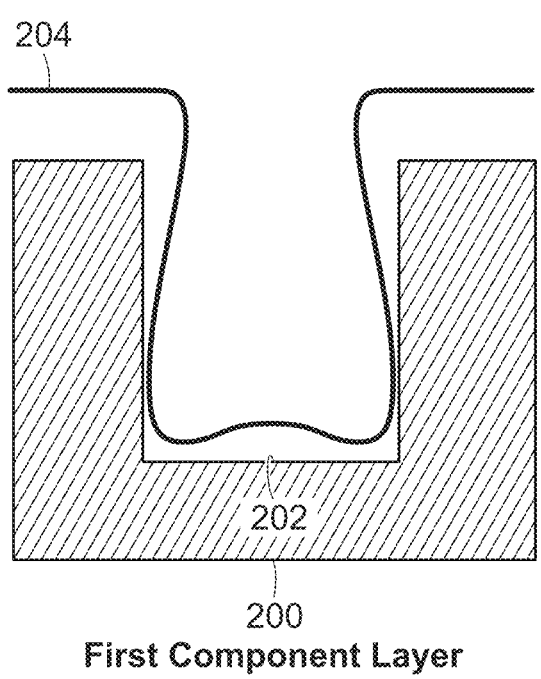
FIG. 5A — First Component Layer
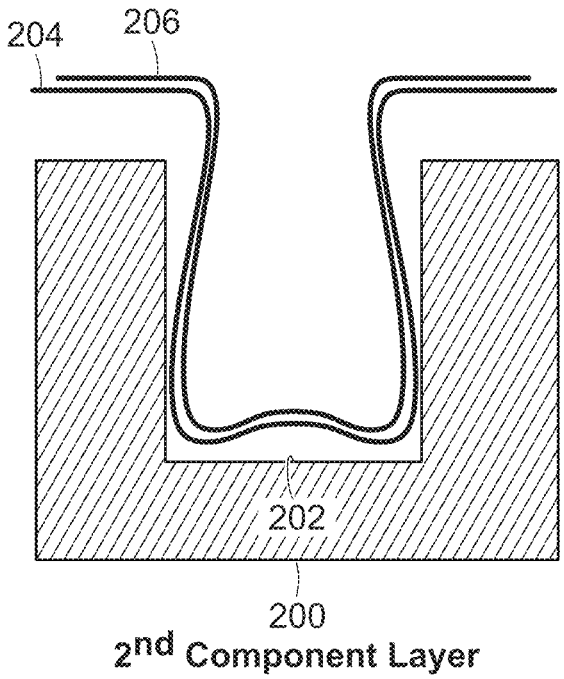
FIG. 5B — 2nd Component Layer
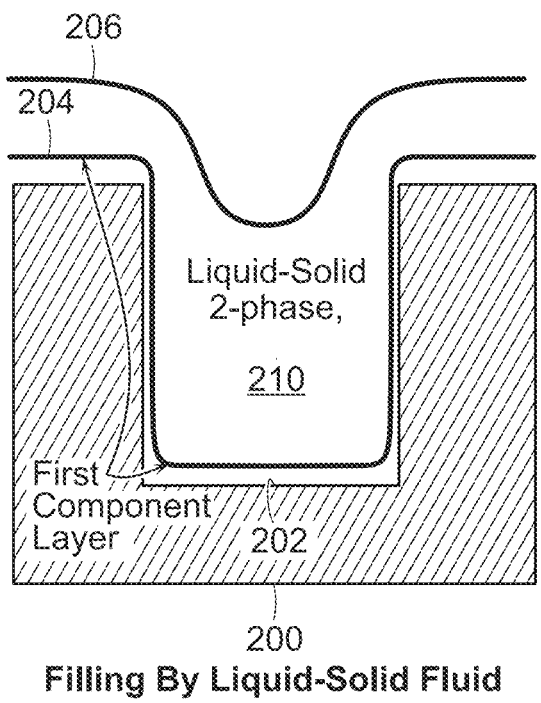
FIG. 5C — Filling By Liquid-Solid Fluid
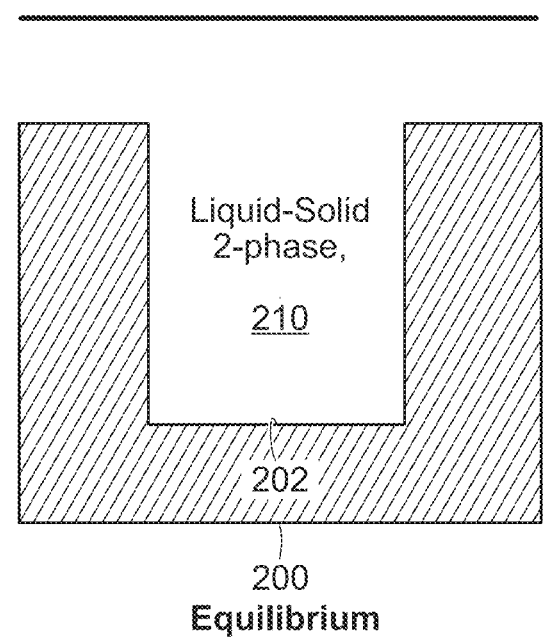
FIG. 5D — Equilibrium First Component Layer 2nd Component Layer Filling By Liquid-Solid Fluid Equilibrium

METHOD OF FILLING GROOVES AND HOLES IN A SUBSTRATE

CROSS REFERENCE TO RELATED APPLICATIONS

This application is related to and claims the benefit of U.S. Provisional Application No. 62/785,653, filed on Dec. 27, 2018, the contents of which are incorporate herein in their entirety by reference.

BACKGROUND

1. Technical Field

The present disclosure is related to semiconductor integrated circuit device manufacturing processing technology and, in particular, to metallization processes used in integrated circuit device manufacturing processing.

2. Discussion of Related Art

Electrical power and signals are transmitted across and through various integrated circuit (IC) structures by metal lines and vias. In modern IC manufacturing, the lines and vias are constructed by depositing metal layers into grooves and holes that have been etched into a substrate. This is results in the metal filling the grooves and holes and also being deposited over the surfaces separating them. This excess metal is typically removed from the surfaces that separate the grooves and holes. This method is referred to as damascene metallization.

The methods used to deposit damascene metallization vary. Sputtering, also called physical vapor deposition (PVD), is a popular thin layer deposition method because of its relatively low cost. With PVD, a technique called "PVD reflow" is used to fill holes and grooves in a substrate. PVD reflow relies on heating the layer to roughly ⅔ of its Kelvin melting temperature during deposition to enhance surface and grain boundary diffusion. At PVD reflow temperature, the surface layer of deposited atoms diffuse rapidly to reduce the energy of the surface, while the bulk of the layer experiences less rapid grain boundary diffusion. On a surface that has grooves and holes, the energy is reduced by surface and grain boundary diffusion and results in filling the grooves and holes.

Other methods of filling grooves and holes include electroplating (EP), chemical vapor deposition (CVD), and combinations of all three (CVD, PVD, and EP). In all cases, the material remaining outside the grooves and holes is removed afterward by, for instance, chemical-mechanical polishing (CMP), leaving behind only the layer material filling the grooves and holes.

Virtually all PVD reflow techniques utilize aluminum or lightly alloyed aluminum as the conductive metal for the layer. The reasons are its low melting temperature and high electrical conductivity. Pure aluminum melts at 933K, or 660° C., so reflow can be theoretically achieved starting at about 616K (about 343° C.). Virtually all conventional aluminum reflow process methods use a temperature range above 400° C. The reason ascribed to the difference between theoretical reflow temperature 343° C. and the temperature used in practice is the reduction in surface and bulk diffusion caused by residual oxygen in the deposition environment. Freshly deposited aluminum atoms are highly reactive and will form aluminum oxides by reaction with O2 or H2O: $4Al+3O_2 \gg 2Al_2O_3$ and $2Al+3H_2O \gg Al_2O_3+3H_2$. There is always residual O2 and H2O in the PVD environment, and though very low in good PVD environments still enough to cause some of the deposited Al to be "pinned" by oxide formation, reducing surface diffusion.

In some cases, it is important to keep processing temperatures well below 400° C. This is especially true in advanced three-dimensional (3D) integration in which various device structures are interconnected vertically by stacking and bonding their substrates. Excessive thermal expansion and contraction of the varying substrate materials and the vertical metal conductors can lead to damage and device failure. In the case of some special substrate materials, such as HgCdTe, the processing temperature must be kept below 150° C.

Since the 1990's, electroplated copper (EP-Cu) has been displacing CVD and PVD reflow for filling grooves and holes in advanced IC manufacturing. Although more expensive, EP-Cu tends to be more reliable and provides a conductor with lower electrical resistivity. It still requires PVD and sometimes combinations of CVD and PVD to provide diffusion barriers and seed layers, since copper diffuses readily through silicon, and the EP-Cu process requires a thin copper seed layer to grow on. Although the higher relative complexity and expense are drawbacks, they are not forbidding.

In other cases, the structures to be filled may comprise large numbers of holes that are very close to one another, meaning the distance between holes is on the order of one to five hole diameters and less than about five micro-meters. In these cases, the normal grain boundary diffusion of a PVD reflow aluminum layer or an EP-Cu layer may exhibit grain growth that spans some holes and robs material from one or more of them. The result is random empty holes.

What is needed is an inexpensive method of reliably filling grooves and holes on substrates, especially high-density arrays of grooves and holes, at low temperatures.

SUMMARY

According to a first aspect, a method of forming a pattern of metallic material on a substrate is provided. The method includes: providing a plurality of void regions on a surface of the substrate, the plurality of void regions defining the pattern; at a first temperature, depositing a first layer of a first metallic material of a eutectic-forming pair of metallic materials on the substrate to form a conformal metallic film over the substrate and over the surfaces of the plurality of void regions; warming the substrate and conformal metallic film to a second temperature greater than a eutectic-liquid-formation temperature of the eutectic pair of metallic materials; and at the second temperature, depositing the second metallic material of the eutectic-forming pair of metallic materials on the conformal metallic film to initiate a eutectic-liquid-forming reaction, such that the plurality of void regions are filled with a mixture of the first and second metallic materials of the eutectic-forming pair of metallic materials.

In some exemplary embodiments, one of the first and second metallic materials of the eutectic-forming pair of metallic materials comprises aluminum. In these exemplary embodiments, the other of the first and second metallic materials can comprise at least one of tin, indium, bismuth, gallium, copper, lead, zinc and silicon.

In some exemplary embodiments, one of the first and second metallic materials of the eutectic-forming pair of metallic materials comprises copper. In these exemplary embodiments, the other of the first and second metallic materials can comprise at least one of tin, indium, gallium, tellurium, praseodymium, and magnesium.

In some exemplary embodiments, the method further comprises depositing a conformal wetting layer on the substrate before depositing the first layer of the first metallic material of the eutectic-forming pair of metallic materials on the substrate. The conformal wetting layer can be formed of a material which includes one of the first and second metallic materials of the eutectic-forming pair of metallic materials. Alternatively, the conformal wetting layer can be formed of a material which is not one of the first and second metallic materials of the eutectic-forming pair of metallic materials.

In some exemplary embodiments, the second metallic material is deposited on the conformal metallic film prior to warming the substrate and conformal metallic film to the second temperature. In other exemplary embodiments, the second metallic material is deposited on the conformal metallic film simultaneously with warming the substrate and conformal metallic film to the second temperature.

According to a second aspect, a method of forming a pattern of metallic material on a substrate is provided. The method includes: providing a plurality of void regions on a surface of the substrate, the plurality of void regions defining the pattern; at a first temperature, depositing a first layer of one or more metallic materials of a group of eutectic-forming metallic materials on the substrate to form a conformal metallic film over the substrate and on surfaces of the plurality of void regions; warming the substrate and conformal metallic film to a second temperature greater than a eutectic-liquid-formation temperature of the group of eutectic-forming metallic materials; and at the second temperature, depositing other metallic materials of the group of eutectic-forming metallic materials on the conformal metallic film to initiate a eutectic-liquid-forming reaction, such that a eutectic liquid surface is formed and flows into the plurality of void regions.

In some exemplary embodiments, the conformal metallic film comprises an alloy formed from two or more metallic materials selected from the group of eutectic-forming metallic materials.

In some exemplary embodiments, the eutectic liquid surface comprises an alloy formed from two or more metallic materials selected from the group of eutectic-forming metallic materials.

In some exemplary embodiments, the other metallic materials are deposited on the conformal metallic film prior to warming the substrate and conformal metallic film to the second temperature.

In some exemplary embodiments, the other metallic materials are deposited on the conformal metallic film simultaneously with warming the substrate and conformal metallic film to the second temperature.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

FIGS. 5A through 5D include schematic cross-sectional views of a substrate with grooves and holes, illustrating steps in filling process of the disclosure, according to some exemplary embodiments.

DETAILED DESCRIPTION

A eutectic is a mixture of components, in fixed proportions, that melts and solidifies at a single temperature that is lower than the melting temperatures of the separate constituents or of any other mixture of them. If an arbitrarily chosen liquid mixture of such components is cooled, a temperature will be reached at which one component will begin to separate in its solid form and will continue to do so as the temperature is further decreased. As this component separates, the remaining liquid becomes continuously richer in the other component, until, eventually, the composition of the liquid reaches a value at which both components begin to separate simultaneously as an intimate mixture of solids. This composition value is the eutectic composition, and the temperature at which it solidifies is the eutectic temperature.

Figure 1:
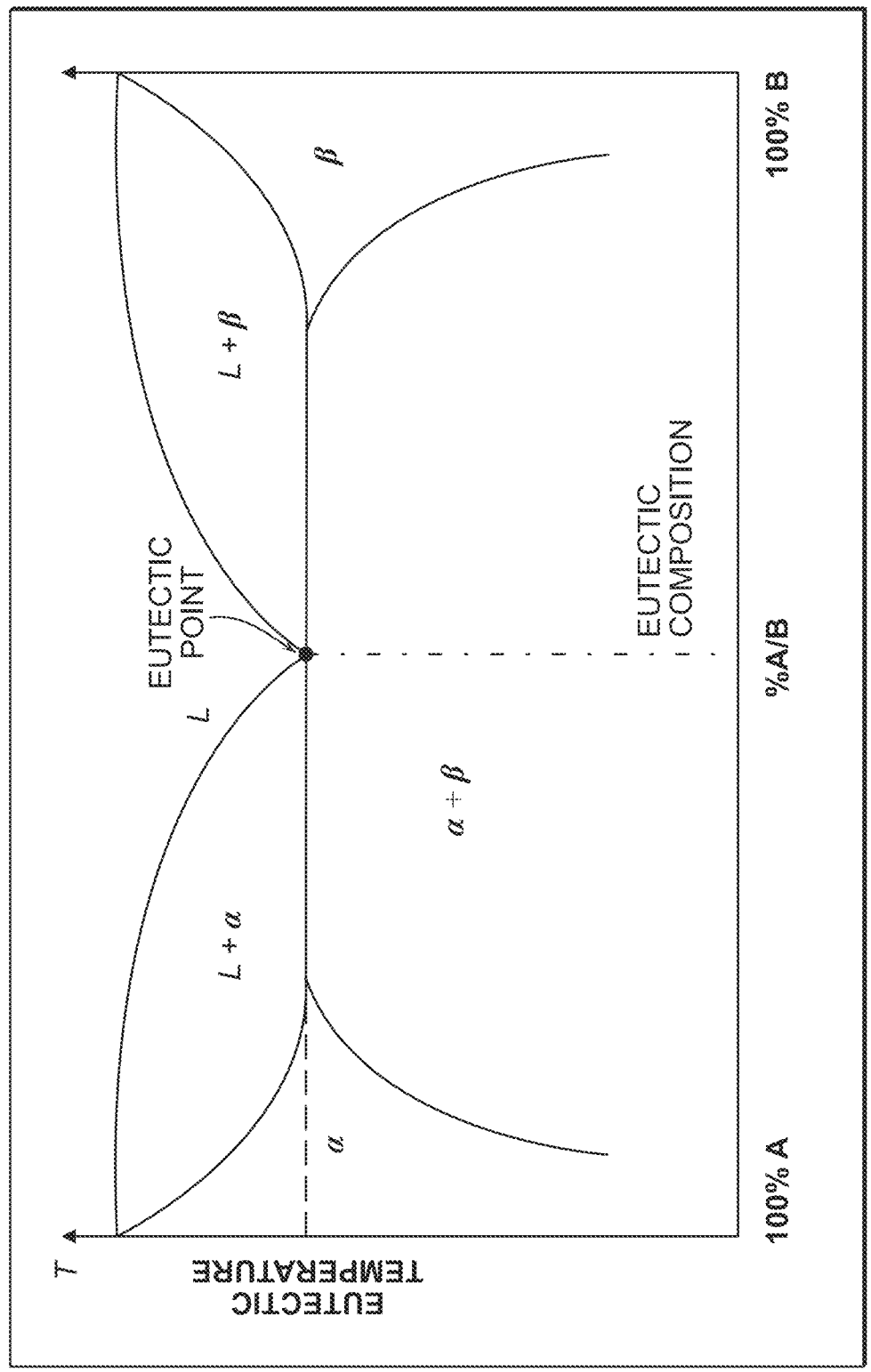
FIG. 1 includes a generic two-component phase diagram with a eutectic composition.

FIG. 1 is a generic representation of a two-component (A and B) phase diagram with a eutectic composition. At the eutectic temperature, the single-phase liquid (L) is composed of the eutectic composition. Above the eutectic temperature, the single-phase liquid region broadens in composition, and to the right and left of it exist two-phase regions labeled L+β and L+α, corresponding to liquid-solid compositions, with β representing B-rich compositions, and α representing A-rich compositions. At a given temperature above the eutectic temperature, a liquid-solid composition has viscosity relative to the liquid viscosity that depends on its volume fraction of solids.

At a temperature below the eutectic temperature, a layer of one component may be deposited upon a layer of the other component, forming a bilayer with a defined interface between the two components. At a microscopic level, this interface has a phased composition that spans the phase diagram for the two components. A laminar element of volume within the interface can therefore be assumed to contain a mixture with the eutectic proportions. For the purpose of this disclosure, the "eutectic lamina" is defined as this laminar element.

Out of the various methods for forming layers, especially the second component layer, sputtering has a unique advantage. During sputter deposition, the component being deposited arrives in atomic form with some kinetic energy, typically 1-5 eV. The arriving atoms can therefore penetrate the surface of the first layer, so the initial interface containing the phased composition of both components is broadened. If the temperature of the interface is above the eutectic melting temperature, the liquid composition lamina is also broadened and becomes a eutectic liquid. Within the interface, above and below the liquid composition lamina exist the two-phase regions, L+β and L+α.

The viscosity (η) of a liquid-solid mixture may be approximated using the Einstein-Roscoe equation:

$$\eta = \eta_0 * (1-\phi/\psi)^{-2.5};$$

in which $\eta_0$ is the viscosity of the liquid without solids (normalized here to 1), $\phi$ is the fraction of solids, from 0 to $\phi_0$, $\psi$ is equal to $1-\phi(1-\phi_0)/\phi_0$. The approximate value of $\phi_0$ is 0.7, the solid fraction content of a liquid-solid mixture above which its viscosity is too high to exhibit fluid behavior.

Figure 2:
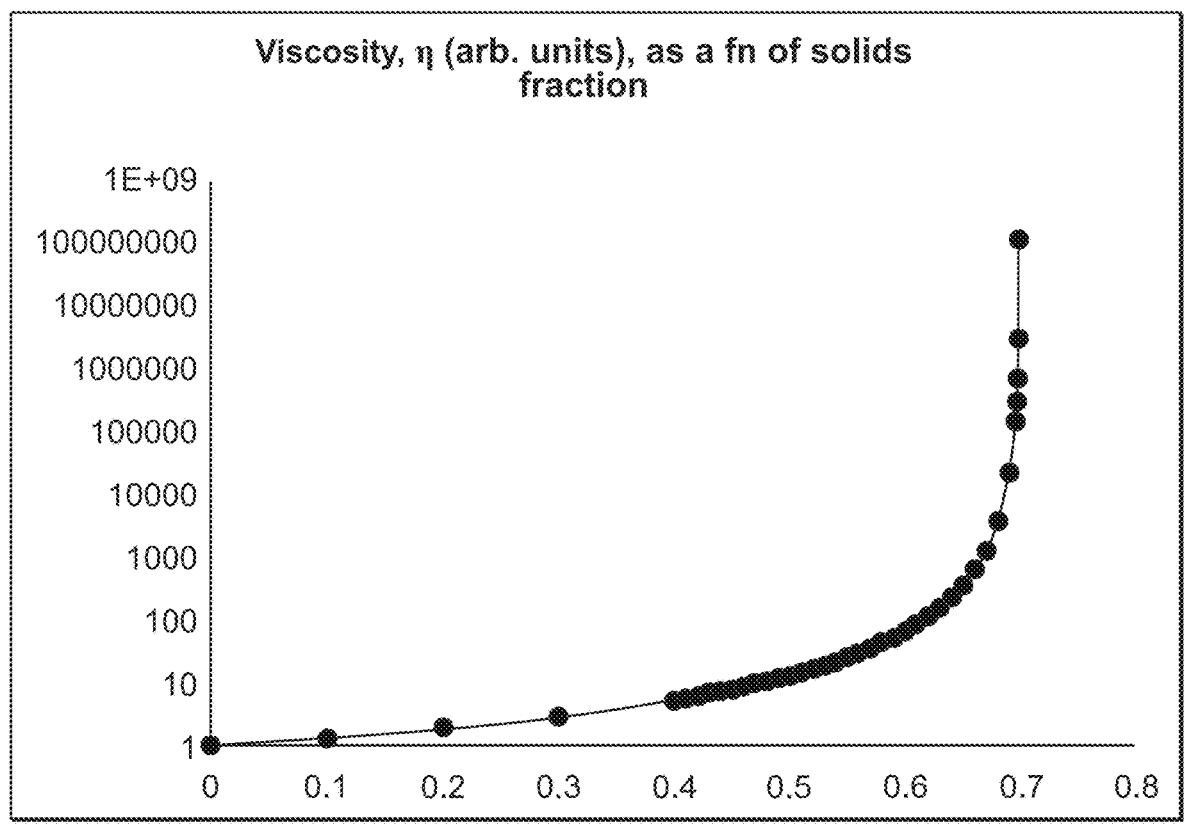
FIG. 2 includes a plot of the Einstein-Roscoe equation for single-phase liquid viscosity normalized to unity.

FIG. 2 includes a plot of the Einstein-Roscoe equation for $\eta_0$ (the single-phase liquid viscosity) normalized to unity. It is noted that when the solid fraction is 0.3, the viscosity of the two-phase liquid-solid is three times higher than $\eta_0$. To visualize this, a similar difference in viscosity exists between water and light oil. At or above $\phi=0.7$ the viscosity of the two-phase liquid-solid is so high that 0.7 can be thought of as the transition value where the composite changes from solids in a liquid matrix, to liquid in a solid matrix.

According to the present disclosure, a layer comprised of a first component known to form a eutectic combination with a second component is formed on a substrate with surface features that can be described as grooves or holes. The layer is heated to a temperature equal to or greater than the eutectic temperature while depositing a layer of the second component, so that a two-phase fluid composition is formed of eutectic liquid and solids in a suitable ratio to enable mass transport of the fluid into the holes and grooves, thereby filling them.

According to a first embodiment, the method of the disclosure is carried out by depositing a first layer, then depositing a second layer on top of the first layer while providing enough heat energy so that the eutectic temperature of the eutectic combination between components of the two layers is met or exceeded. In some exemplary embodiments, the eutectic temperature is exceeded by 0.0%-20% and, in some particular exemplary embodiments, by 0.5%-5.0% (Kelvin). A low viscosity two-phase fluid surface layer comprised of eutectic liquid mixed with solid particles (crystallites) forms and flows to fill the grooves and holes. The viscosity of the two-phase fluid surface layer increases as the components of the two layers combine and the volume fraction of solids reaches equilibrium. Upon cooling, the solids in the two-phase fluid precipitate out of the liquid matrix, said precipitation favored thermodynamically onto the higher-energy surfaces within the grooves and holes while exuding the excess two-phase fluid out of the holes and grooves. The composition of the precipitates in the grooves and holes may be a mixture, an intermediate compound, or an alloy of the components, or it may be one or the other component in solid form with a very small percentage of the other component dispersed within its bulk. Excess material on the surface is later removed, for instance by chemical-mechanical polishing (CMP), leaving behind grooves and holes filled with the solid precipitate.

If the equilibrium composition is chosen to be the eutectic composition, then the equilibrium phase will be a liquid. In this case, steps are taken to insure that the substrate surface is wetted by the liquid so that beading and balling up of the liquid does not occur. In other words, the substrate-liquid interface must have lower free energy than the liquid surface. This may be accomplished by inserting a layer of material that adheres well to the substrate and is wetted by the eutectic liquid, or by treating the substrate surface prior to deposition of the eutectic composition. The latter may comprise a chemical dip, plasma exposure, oxidation, nitridation, or other effective treatments known to those familiar with the art.

Of the various methods for forming layers, especially the second component layer, sputtering is particularly advantageous. When the second component is sputter-deposited onto an existing first component layer, there forms an initial interface across which the composition changes from the component being deposited to the component of the existing layer. During sputter deposition, the component being deposited arrives in atomic form with some kinetic energy, typically 1-5 eV. This is adequate to cause the arriving atoms to penetrate the surface of the first layer, so the initial interface can be visualized to contain a phased composition of both components with every proportion existing in between. A laminar element of volume within the interface can therefore be visualized that contains a mixture with the eutectic proportions. If the temperature of the interface is at the eutectic melting temperature, the mixture within that volume becomes a eutectic liquid. If the eutectic temperature is exceeded, compositions close to the eutectic composition will also melt to form a single-phase liquid. Rapid diffusion through the liquid supplies more material to the eutectic reaction, generating more liquid. Diffusion of the eutectic liquid into the solid layer beneath results in the release of solid phase material, in the form of crystallites or grains, into the liquid matrix. This mixture of solids in a liquid matrix will exhibit fluid viscosity, following approximately the Einstein-Roscoe Equation.

Figure 3:
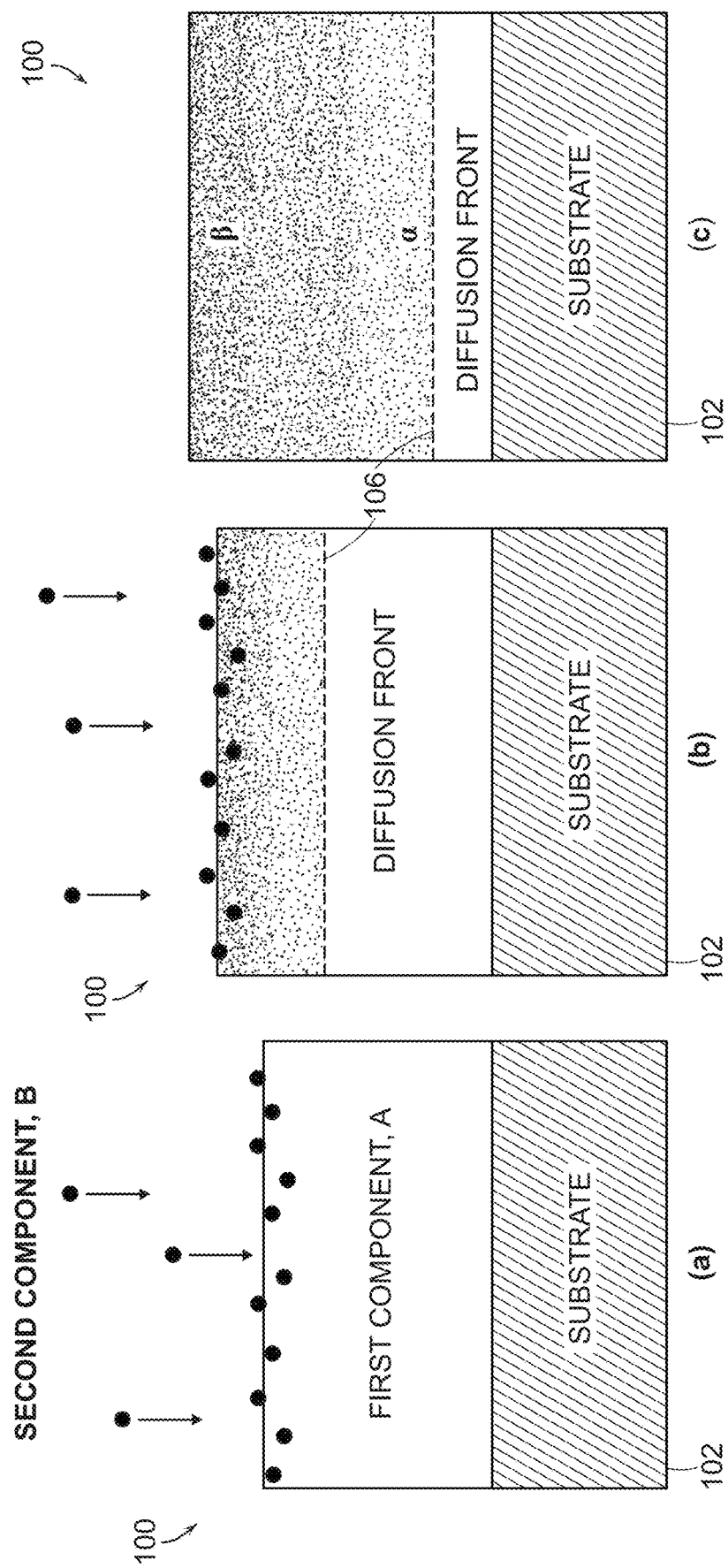
FIG. 3 includes three schematic cross-sectional views, labeled (a), (b), and (c), which illustrate the process of deposition in a two-component system, according to some exemplary embodiments.

FIG. 3 includes three schematic cross-sectional views, labeled (a), (b), and (c), which illustrate the process of deposition in a two-component system, according to some exemplary embodiments. Referring to FIG. 3, device 100 includes a substrate 102 on which layers are formed according to the present disclosure. Referring to view (a), first component A is formed on substrate 102. Referring to views (a), (b), and (c), during deposition of second component B at or above the eutectic temperature, a diffusion front 106 develops at the interface. While the substrate is maintained at this temperature, diffusion front 106 will propagate into the layer comprising the first component. Diffusion front 106 is a moving boundary before which is the solid first component and behind which is the two-phase liquid-solid composed of the first and second components. This two-phase region will have a compositional gradient between diffusion front 106 and the deposition surface, where the second component B is arriving.

Figure 4:
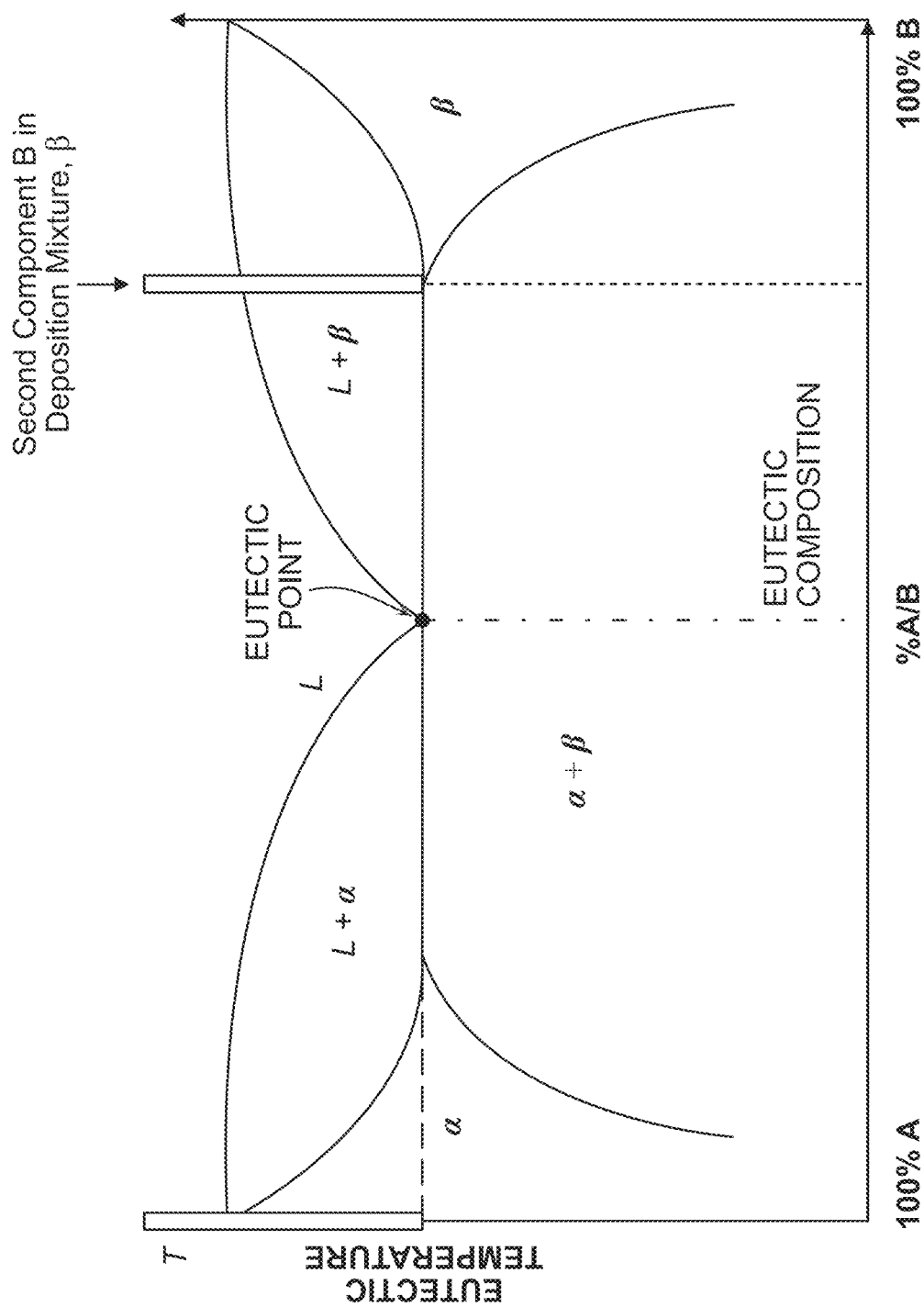
FIG. 4 includes a modified two-component phase diagram.
Figure 5E:
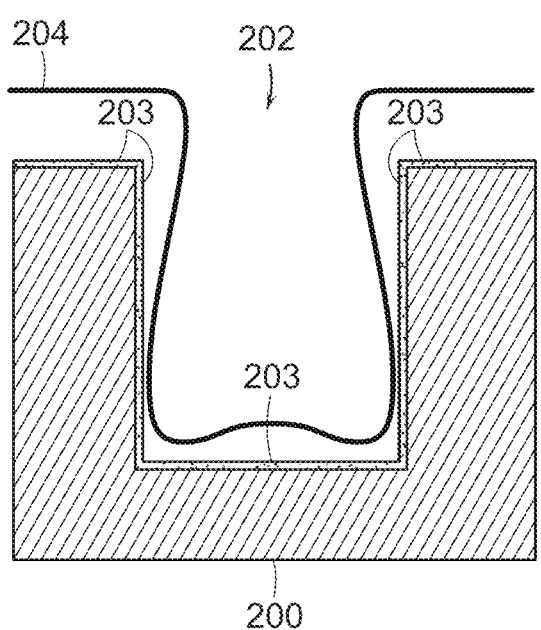
FIGS. 5E through 5H include schematic cross-sectional views of a substrate with grooves and holes, illustrating steps in filling process of the disclosure, analogous to FIGS. 5A through 5D, respectively, according to some other exemplary embodiments.
Figure 5F:
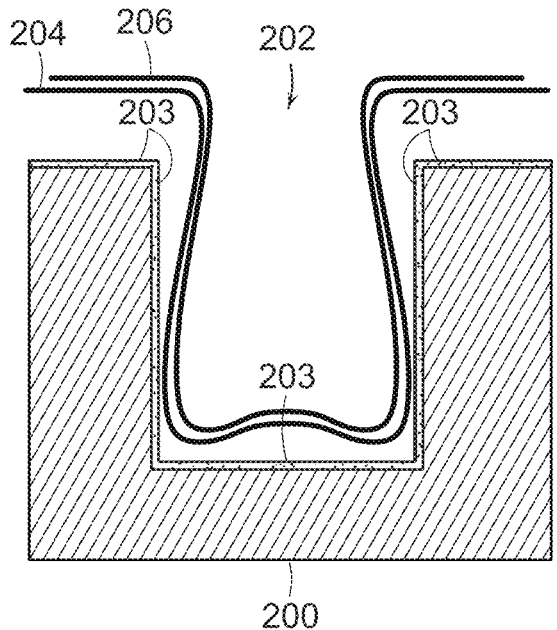
Figure 5G:
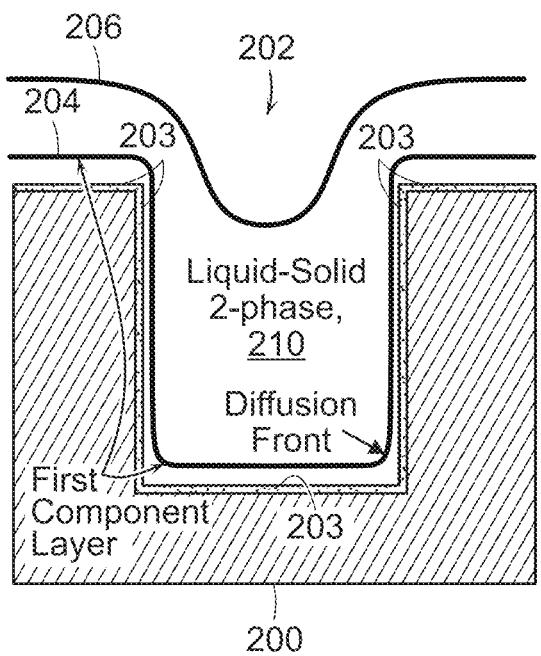
Figure 5H:
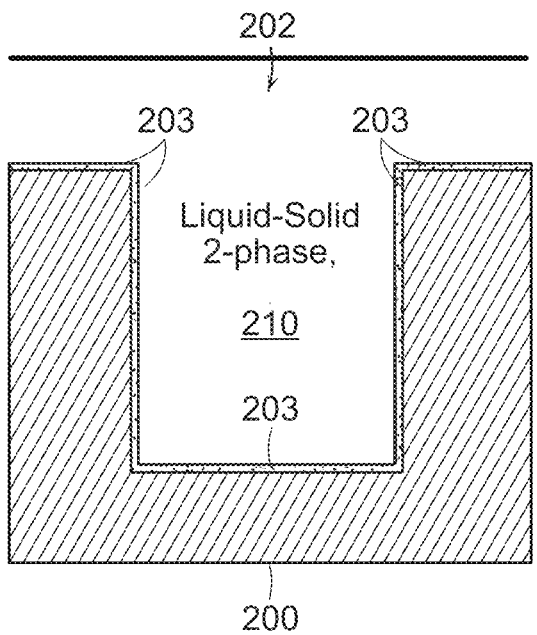

For some two-component eutectic systems, the first layer and the subsequently deposited second layer may be selected to be mixtures of the two components. This can be done advantageously to promote lower viscosity near the surface during deposition. For instance, in the generic phase diagram of FIG. 1, the first layer may be purely component A, while the composition of the deposited second component B may be doped with component A, selected to provide a mixture composition at the surface that is L+β. This situation is illustrated in the modified phase diagram of FIG. 4. There are only practical limitations to the mixture compositions of the first layer and the deposited second layer, depending on the equipment used. Similarly, for ternary, quaternary, and higher-order eutectics, mixing of components in the first layer and subsequent depositions can be used to place layer composition in a favorable position in the multi-dimensional phase diagram relative to liquid-solid phases and subsequent deposition compositions, at or above the eutectic temperature.

According to the disclosure, when deposition onto the first layer is stopped, and the temperature is maintained, diffusion of solids into the eutectic liquid, and finally (for high fractional volumes of solid phase) eutectic liquid into the solid matrix, continues until equilibrium is reached, which equilibrium is characterized by a uniform two-phase mixture of eutectic liquid and solids in the ratio of their availability. In general, the volume ratio of availability for the two components in the equilibrium state will be very close to the ratio of the relative thicknesses of the layers if deposited separately. Thus, by knowing the deposition rates of each component, the atomic ratio of each in the equilibrium liquid-solid two-phase layer can be determined.

In general, in some exemplary embodiments, the volume ratio of the two components is chosen so that the equilibrium volume fraction of solids in the equilibrium liquid-solid material is 0.7 or greater. By doing this, the liquid-solid fluid has its lowest viscosity at the beginning of deposition onto the first layer, and reaches a state of highest viscosity (or solidification) as the two-phase material reaches its equilibrium composition, where it transitions from solids in a liquid matrix to liquid in a solid matrix. This is an important consideration for preventing "de-wetting," a condition in which a low-viscosity fluid layer may bead up on the substrate. At volume fractions greater than about 0.7, the interface between the first layer and the substrate will remain close to a solid-to-solid interface, and de-wetting is avoided.

In some exemplary embodiments, adhesion of the first layer to the substrate may be promoted by the deposition of a "wetting layer" selected for known good adhesion to the substrate and the first layer, as well as other properties such as lack of reactivity with the eutectic liquid and resistance to diffusion of the eutectic liquid at any temperatures that may be experienced during later processing.

An exemplary illustration of the first embodiment of the present disclosure involves first the selection of a binary eutectic system. The substrate to be coated has a determined size and density of grooves and holes to be filled, and the overall volume of material needed to fill the grooves and holes is determined. In general, this volume should converted into a film thickness, and added to the desired final film thickness. This will be the nominal sum of first and second component deposition thicknesses, i.e., $T_{final}=T_1+T_2$.

Next, it is determined which component exhibits the best adhesion to the substrate when deposited as a layer. This should be selected as the first layer. If both components exhibit poor adhesion, then a wetting layer is selected that adheres well to at least one component; that component will comprise the first layer.

Once the first layer is determined, the phase diagram of the selected binary eutectic is consulted. If the liquid-solid composition is to have high viscosity at equilibrium, a two-phase region with solid volume fraction of 0.7 or higher must be selected. Next, the volume fraction of the two components at this selected composition is determined, and each is multiplied by $T_{final}$ to determine the thickness of the first layer and the deposition time of the second.

FIGS. 5A through 5D include schematic cross-sectional views of a substrate with grooves and holes, illustrating steps in filling process of the disclosure, according to some exemplary embodiments. FIGS. 5E through 5H include schematic cross-sectional views of a substrate with grooves and holes, illustrating steps in filling process of the disclosure, according to some other exemplary embodiments. FIGS. 5E through 5H are analogous to FIGS. 5A through 5D, respectively, with the addition of an optional wetting layer 203.

In some exemplary embodiments, wetting layer 203 comprises a thin layer of material, or a stack of thin layers of different materials, that improves adhesion between the substrate 200 and the eutectic component layers 204, 206 deposited subsequent to wetting layer 203. Wetting layer 203 may be selected for the low free energy interface or boundary it forms with first component layer 204 or the mixture of component layers 204, 206 when they combine to form a liquid-solid 2-phase composition, or the pure eutectic liquid composition. Wetting layer 203 can be deposited by any suitable method know to those familiar with the art, including sputtering, evaporation, CVD, or atomic layer deposition (ALD). An example of wetting layer 203 is the commonly used TiW (80-90 wt. % tungsten, balance titanium), which is deposited before first component layer 204, e.g., aluminum, in the exemplary embodiments using Al—Sn. The TiW wetting layer 203 provides excellent adhesion to both silicon and aluminum and acts as an effective barrier to diffusion between both.

With reference to FIGS. 5A through 5H, the following steps are taken. A substrate 200 with one or more grooves and/or holes 202 on its surface is prepared for formation of the first layer. This may entail deposition of wetting layer 203, as illustrated in FIGS. 5D through 5H, and/or various other preparation methods known to those familiar with the art.

A first component layer 204 is formed to the correct thickness on the substrate 200 and into grooves and holes 202, the thickness determined to be the product of its equilibrium volume fraction and $T_{final}$. First component layer 204 may be deposited by any method known by those familiar with the art, including magnetron sputtering, evaporation, ion beam deposition, CVD, or EP.

Next, substrate 200 is heated to a selected temperature above the eutectic temperature, preferably 1% to 10% higher than the Celsius value of the eutectic temperature.

Next, a second component layer 206 is deposited for a pre-determined time equal to that required to form a layer of a thickness on the substrate determined to be the product of its equilibrium volume fraction and $T_{final}$. In some exemplary embodiments, second component layer 206 is deposited using a vacuum deposition method, for example. Other approaches can alternatively be used.

Next, the substrate 200 is maintained at the selected temperature for a period determined by experimentation to result in the filling of all grooves and holes 202, or for a period determined by experimentation to be adequate for the formation of an equilibrium state in the liquid-solid 2-phase 210. Next, substrate 200 is cooled in vacuum.

Figure 6:
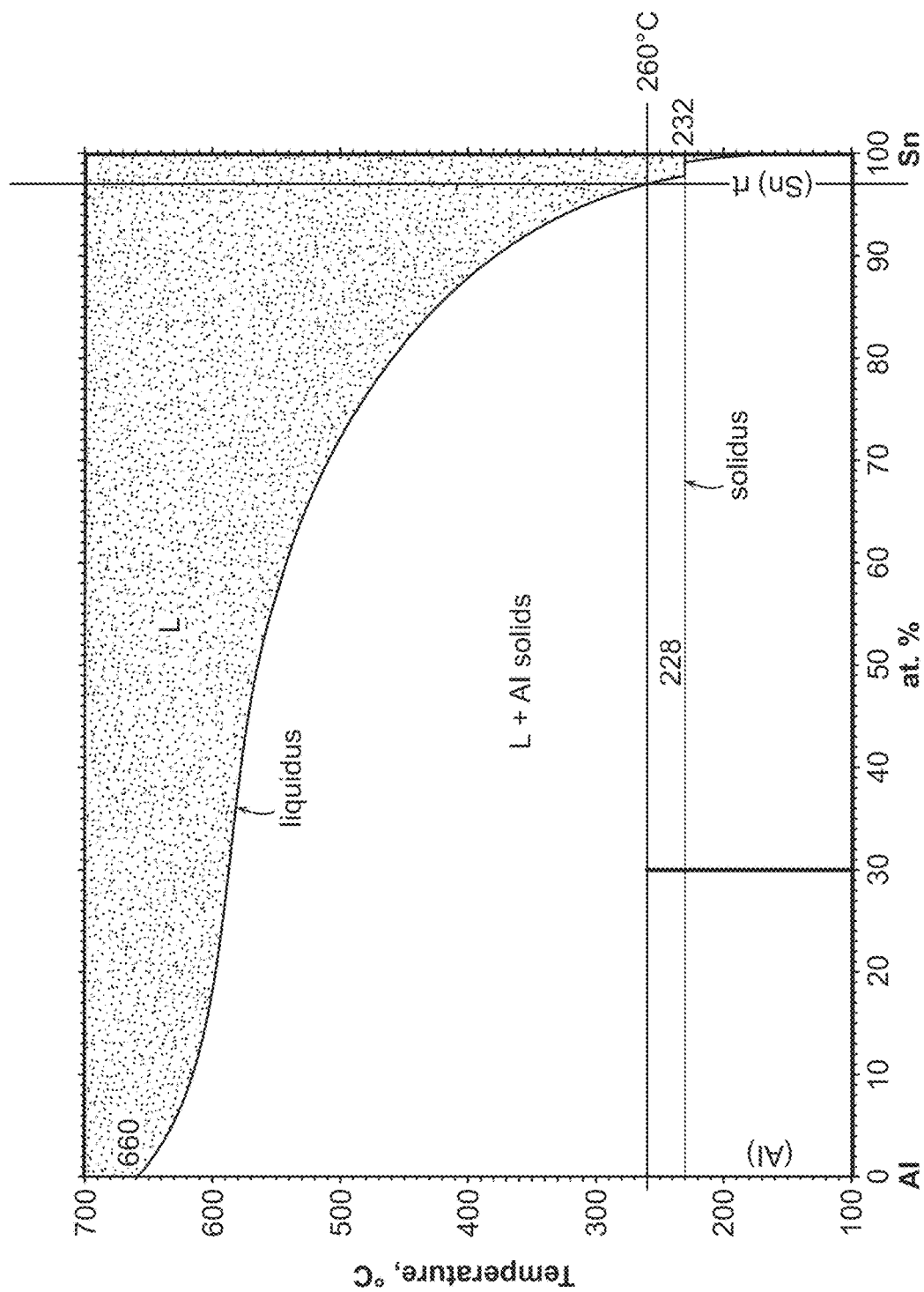
FIG. 6 includes a temperature-composition Al—Sn phase diagram.

One example of the first embodiment uses an aluminum (Al) first component layer 204 of 400 nanometers thickness and a tin (Sn) second component layer 206 of 100 nanometers thickness, deposited at a eutectic reflow temperature of 260° C. This 4:1 ratio provides a volume fraction of solids that is roughly 0.8 in the equilibrium state at 260° C. FIG. 6 includes a compositional phase diagram of the Al—Sn system. Note that the eutectic composition is about 97 atomic percent Sn at 260° C., and that Sn melts at 232° C., 4° C. higher than the eutectic temperature of 228° C. This means that the Sn is in a liquid state upon contact with the Al layer and is fully reacted to form eutectic liquid (97% Sn) when the layer reaches equilibrium.

In the volume ratio 4:1, the atomic ratio of Al:Sn is 7:3, so the equilibrium composition of the layer is marked at 30% Sn with a vertical line that meets a horizontal line placed at 260° C. Since all of the Sn present at equilibrium is liquid, the equilibrium liquid composition must be the same as the eutectic composition: 97% Sn, and 3% Al. At 70 atomic percent, the two-phase liquid-solid fluid has a solid fraction of pure Al of approximately 0.8, which means it is essentially a solid Al matrix holding the eutectic liquid, and has almost infinite viscosity.

While the substrate is maintained at 260° C., and Sn is being deposited, the Al layer is consumed to form both eutectic liquid and the solid (Al crystallite) suspension in the liquid-solid two-phase. This process has a finite rate, and before compositional equilibrium is reached the liquid-solid fluid has an initial high liquid composition and low viscosity. This fluid thickens as the Al layer beneath is consumed, but flows and fills the grooves and vias before compositional equilibrium is reached and the liquid-solid two-phase material is locked in place by its increasing viscosity.

According to the present disclosure, Al in a 2-phase Al—Sn slurry flows and fills high-density via and Damascene topography at process temperatures as low as 235° C. Because the slurry is composed of Al solids in an Al-doped Sn liquid, its equilibrium composition is a function of Al and Sn film thicknesses and can be controlled. An Al-rich composition according to the disclosure yields a 2-phase slurry above 235° C. that flows and fills high-density via arrays with good reliability. Furthermore, upon cooling, normal phase separation yields an Al-rich composition in the vias, without lateral grain growth and associated material competition. The technique of the disclosure overcomes drawbacks associated with Al reflow technology by taking advantage of the way Al and Sn react to form a low-temperature eutectic liquid and an Al—Sn slurry that exhibits high mobility and good adhesion to the oxide surfaces.

According to the disclosure, provided is a technique for effectively filling vias and trenches with sputtered aluminum at temperatures below 300° C., so that underlying structures are not thermally damaged. The technique described in detail provides filling vias and trenches with aluminum without exceeding 280° C. It takes advantage of the way in which aluminum (Al) and tin (Sn) react to form a low temperature eutectic melt, the physical properties of the two-phase Al—Sn composition, and the advantageous way in which Al and Sn separate during cooling from 280° C. to room temperature.

Historically, these properties have been problematic: "Aluminum tin alloys have a wide miscibility gap in the molten state and are virtually insoluble in each other during solidification. Further difficulties arise from the large freezing range of the alloys, which together with the wide density difference between the two components greatly increase the tin segregation during alloy preparation. It has, therefore, been difficult to introduce and uniformly disperse tin in aluminum to the desired extent by conventional melting and casting techniques." ("Metallurgical problems associated with the production of aluminum-tin alloys," Tomasz Stuczyñski; Materials & Design, Volume 18, Issues 4-6, 1 Dec. 1997, Pages 369-372) As described herein in detail, these properties result in selective deposition of Al into grooves and holes and are beneficially applied to the technique of the present disclosure.

According to the technique of the disclosure, as sputtered Sn atoms of this second deposition arrive, they react with the Al atoms on the surface to form a eutectic liquid. The composition of the eutectic liquid is between about 95 and 97.6 atomic percent Sn. A compositional gradient develops as this liquid diffuses into the bulk of the Al film. The composition ranges from a highly mobile Sn-rich eutectic liquid surface to a more Al-rich two-phase composition deeper into the bulk Al film. Via and trench filling proceed as the liquid surface is driven by surface energy reduction, while liquid diffusion into the bulk of the Al film continues to drive the two-phase material toward an equilibrium composition. Though not a homogeneous liquid, the two-phase material includes Al grains suspended in an intergranular eutectic liquid, forming a mobile slurry that diffuses laterally with the surface liquid to fill vias and trenches.

During the cooling of the Al—Sn film, as phase separation proceeds, the surface energy of the film continues to influence the direction of liquid migration. Cooling from 280° C. to 228° C., the Sn-rich liquid in the two-phase material within vias and channels is therefore driven, or "exuded," toward the surface, leaving Al behind. Within a relatively wide range of cooling rates, the result is segregation of Al-rich material into the vias and channels, and an overburden across the tops of vias and channels that is more Sn-rich in composition.

Following this process with a properly selected CMP polishing step results in an Al via or Damascene fill process that can be accomplished at less than 280° C., about 170° C. cooler than prior art Al reflow processes, without the need for barrier and diffusion layers.

Thus, the present disclosure is directed to a method of filling high-density Damascene interconnect structures and vias with a conductive metal. In exemplary embodiments, the method includes depositing a first metal layer of aluminum (Al) to form a conformal coating on a wafer with a dense array of vias and/or trenches. The method further includes heating the wafer to a temperature at or above the eutectic liquid formation temperature for Al and tin (Sn). After this heating, a second metal layer of Sn is deposited while the temperature of the wafer is maintained at or above the eutectic liquid formation temperature, such that the high-density via arrays and/or trenches are filled during cooling with a solid that is primarily composed of Al.

According to the present disclosure, by forming a low-temperature surface melt of the Al—Sn eutectic during sputter deposition, quasi-selective Al filling of high-density via arrays and trenches is achieved, at a temperature about 170° C. lower than conventional Al reflow processing. The technology of the disclosure takes advantage of the thin, highly mobile liquid formed on the Al surface when Sn is deposited on it at a temperature at or above the eutectic temperature of Al—Sn, i.e., 228° C. During the deposition of Sn onto Al at or above the eutectic temperature, thermodynamic forces work to reduce the surface energy, i.e., reduce surface area, driving the eutectic liquid and a highly mobile two-phase composition of Al and Sn to fill vias, trenches and any other features etched into the wafer surface.

In some exemplary embodiments, the resulting filled vias can be used, for example, as pixel interconnections in advanced RF-DBH focal plane array (FPA) devices with no evidence of random via voiding. The process has broad application for any Damascene metallization requirement. Although the Al—Sn example described herein in detail is used as an exemplary illustration, other eutectic combinations can be used as well.

In RF-DBH 3D integration, vertical interconnect systems (high-density via arrays) interconnect across a wafer bond interface. In the case of Ni or copper (Cu) metallization, the bond surface of each wafer has a complimentary set of vias that must be annealed to force a cold-weld connection. The connection is solid-to-solid, and can be hindered or prevented by native oxides that form during air exposure, alignment and bonding. According to the present disclosure, when a low-temperature eutectic such as Al—Sn is used as the metal in the vias, the expansion during anneal is enhanced by the eutectic liquid formation, and the complimentary vias form a diffusion weld. The process is entirely compatible with present sputter cluster tool processing systems and can be adapted inexpensively to other types of sputter systems. As with most PVD processes, the process of the disclosure is relatively inexpensive compared to CVD tungsten (W) and Cu electroplating.

Virtually all published phase diagram data has been generated by melting pre-measured atomic ratio samples of Al and Sn. As noted above, FIG. 6 includes a temperature-composition Al—Sn phase diagram. In the case of sputter-deposited Al—Sn film stacks, the interface represents two sides of the temperature-composition phase diagram at a given substrate temperature. The existing phases across the interface, and the ratio of components at all positions are a function of relative film thicknesses and time at temperature. As shown in FIG. 6, Al melts at 660° C., and Sn melts at 232° C. $Sn_{0.976}Al_{0.024}$ forms a eutectic liquid at 228° C.

Figure 7:
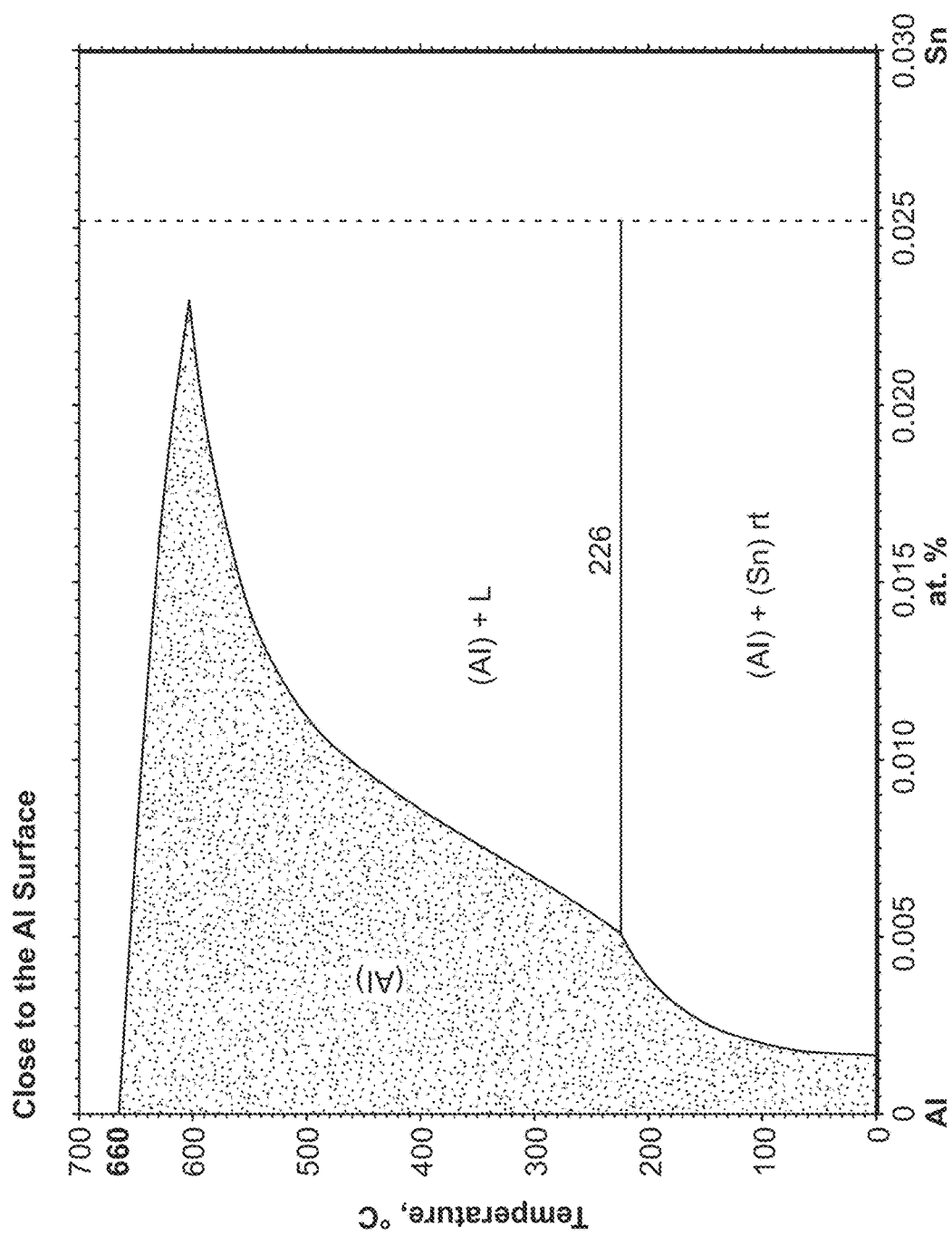
FIG. 7 includes a detailed temperature-composition Al—Sn phase diagram illustrating a portion of the phase diagram of FIG. 6, directed to a region close to the Al surface.

FIG. 7 includes a detailed temperature-composition Al—Sn phase diagram illustrating a portion of the phase diagram of FIG. 6, directed to a region close to the Al surface. Referring to FIG. 7, at 228° C., a eutectic liquid composed of 97.6 atomic percent (at. %) Sn forms at the interface, and at 232° C., the Sn layer becomes liquid. Diffusion progresses until an equilibrium composition is reached, with a solid Al interface at the Al side (left side of diagram), a 2-phase region with composition determined by Al:Sn atomic ration deposited, and a eutectic liquid region (see FIG. 6). At T>228° C., and at compositions less than 97.6% Sn, the Al/Sn film stack converts to a 2-phase mixture of liquid and aluminum. The amount of Sn dissolved in Al is given by the Al solidus curve between the Al and (Al)+L (liquid) regions in the Al side of the phase diagram. The liquid composition is given by the liquidus curve on the Sn side of the diagram. The atomic percent of each component (Al and L) in the 2-phase region is given by the Lever Rule. The lever rule is a tool used to determine the mole fraction of each phase of a binary equilibrium phase diagram. It is used to determine the percent of liquid and solid phases for a given binary composition and temperature that is between the liquidus and solidus line, and is familiar to those skilled in the art. The overall composition of the Al/Sn mixture can be related back to the relative film thicknesses from the molar density calculation.

Figures 8A, 8B:
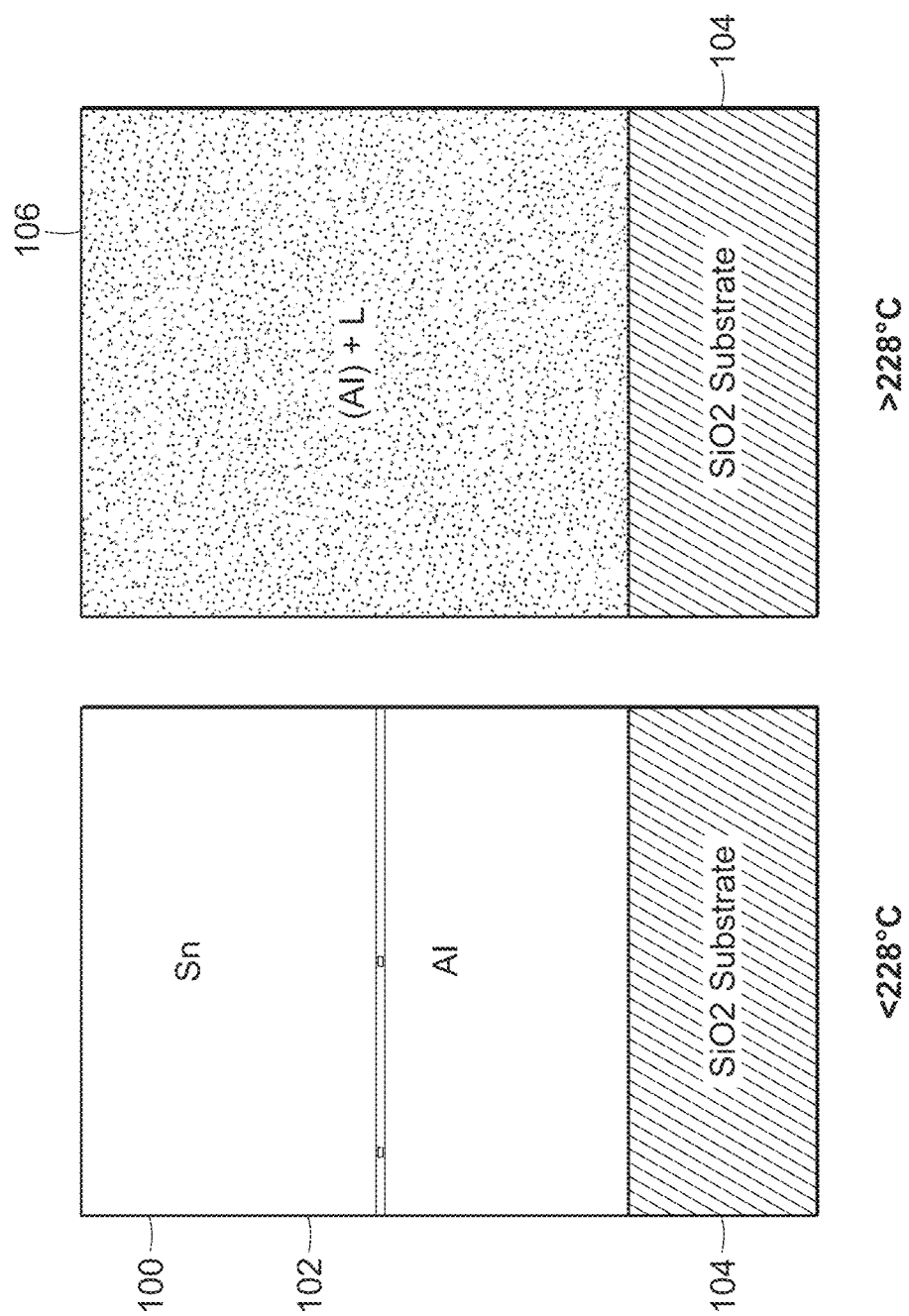
FIGS. 8A through 8C illustrate an exemplary case in which the atomic percent of Al is 70% and the atomic percent of Sn is 30%.
Figure 8C:
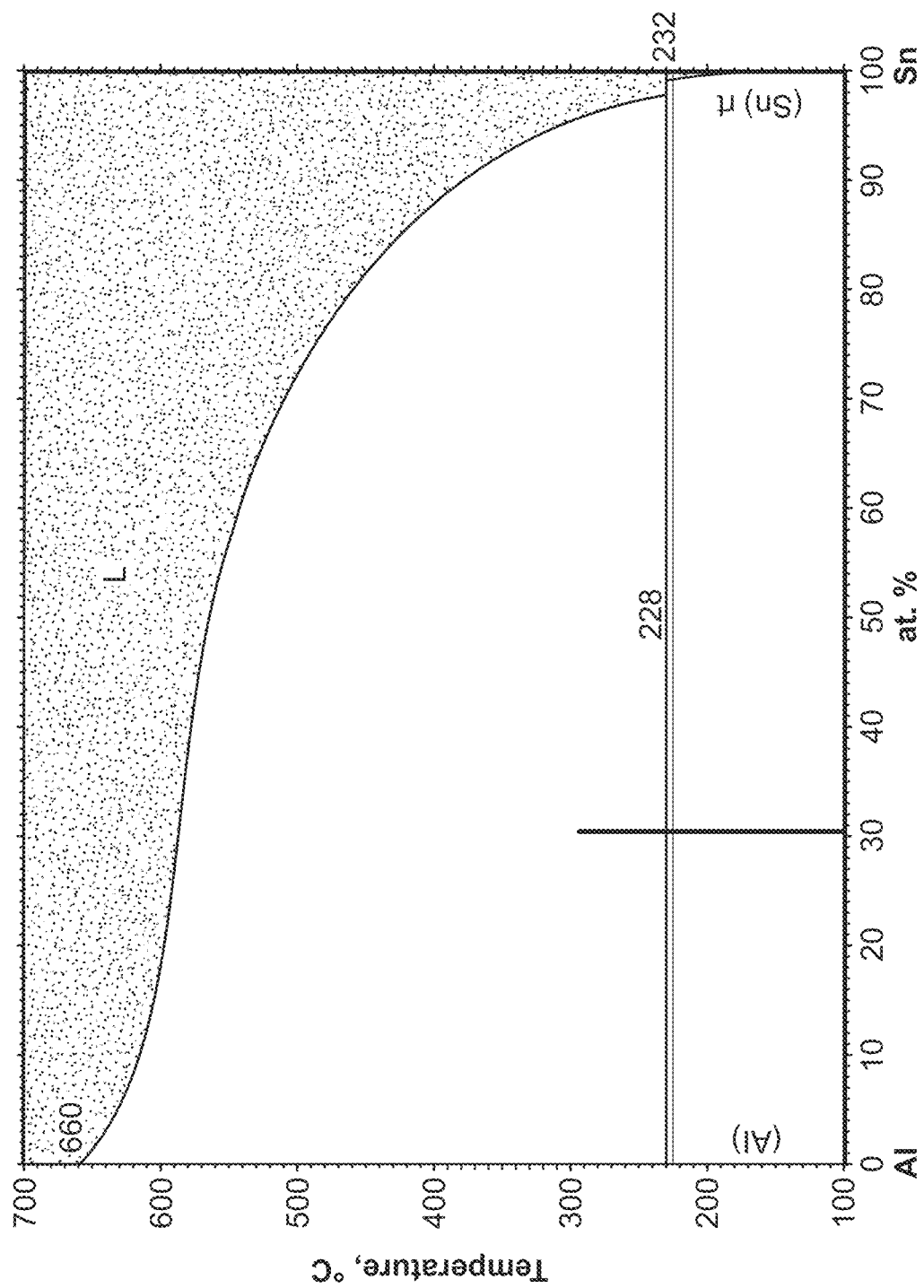

FIGS. 8A through 8C illustrate an exemplary case in which the atomic percent of Al is 70% and the atomic percent of Sn is 30%, according to exemplary embodiments. FIG. 8A includes a schematic cross-sectional diagram illustrating a layer or film 102 of solid Al over a $SiO_2$ substrate 104, and a layer or film 104 of solid Sn over layer or film 102, at a temperature below 228° C., according to exemplary embodiments. In this exemplary illustration, the layer or film thicknesses are 6 kÅ of Al and 3 kÅ of Sn. FIG. 8B includes a schematic cross-sectional diagram illustrating the Al and liquid (L) over $SiO_2$ substrate 104, at a temperature above 228° C., according to exemplary embodiments. FIG. 8C includes the phase diagram of the exemplary illustration. The 30-70 Sn—Al atomic percent line is marked in the phase diagram of FIG. 8C.

Figure 9:
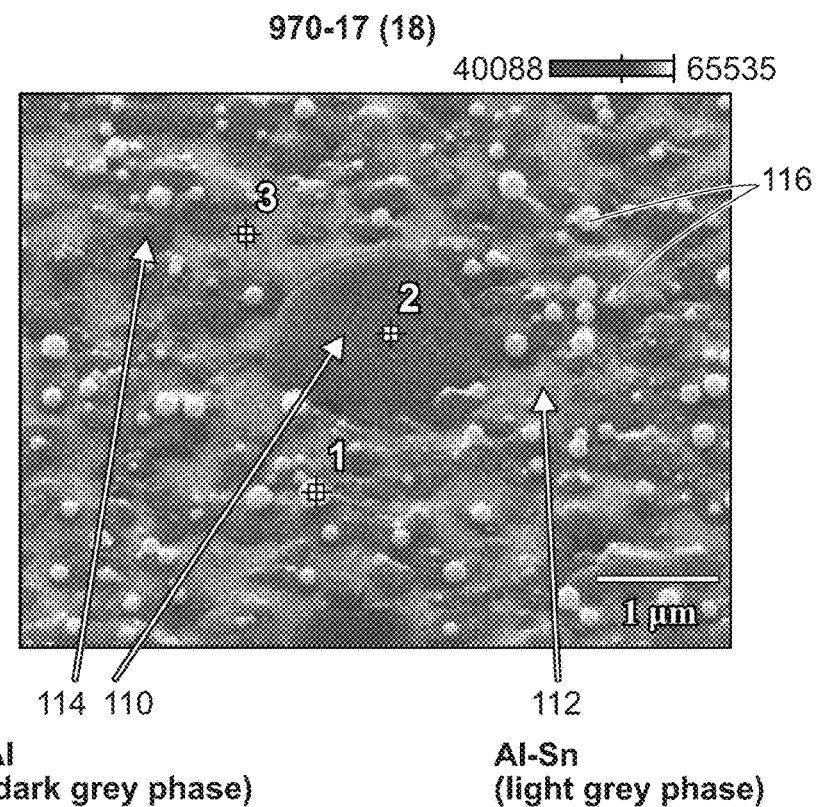
FIG. 9 includes a scanning electron microscope (SEM) image of the top side of a test via and a surrounding field, with the Al and Sn compositions being 56% Al and 44% Sn, with maximum temperature Tmax being 280° C.

With regard to phase separation during cooling, according to the technique of the present disclosure, as the 2-phase (Al)+L cools, it separates or "un-mixes." It is noted that significant differences in composition exist in the resulting solidified material, based on location. In high-density via fields, the vias appear to be filled with Al after solidification. FIG. 9 includes a scanning electron microscope (SEM) image of the top side of a test via and a surrounding field, with the Al and Sn compositions being 56% Al and 44% Sn, with maximum temperature Tmax being 280° C. Based on energy dispersive spectrometer (EDS) analysis of the SEM data of FIG. 9, a single phase appears to occupy via 110, while in the surrounding field, there exist two phases 112 and 114, as well as a scattering of spherical droplets 116. According to the EDS analysis, the light grey phase 112 is a combination of Al and Sn, and the dark gray phase 114, including via 110, is mainly Al. Droplets 116 also appear to be mainly Al, although EDS analysis of such small features cannot be conclusive.

Figure 10:
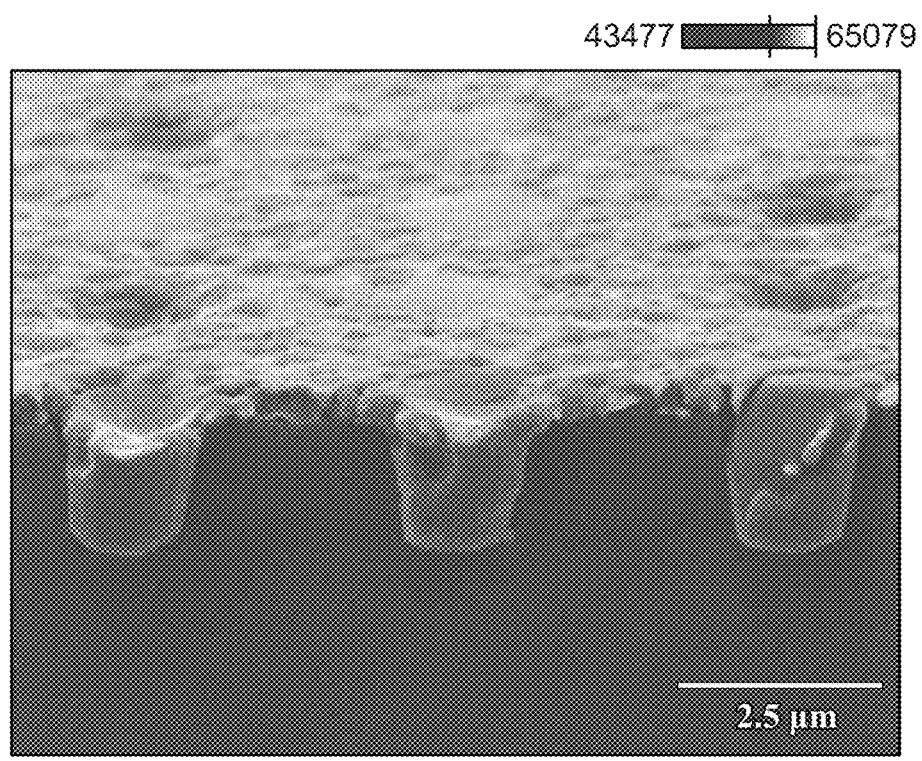
FIG. 10 includes a scanning electron microscope (SEM) image of the top side of a test via and a surrounding field, with the Al and Sn compositions being 70% Al and 30% Sn, with maximum temperature Tmax being 260° C.

The small spherical droplets 116 are not present when the starting film stack composition is increased from 56% to 70% Al. FIG. 10 includes a schematic cross-sectional scanning electron micrograph of holes filled with the exemplary Al—Sn process described herein. The substrate is a thermally oxidized 200-mm silicon wafer that had been patterned and etched to provide arrays of holes 1.6 micro-meters in diameter and roughly 1.7 micro-meters in depth with center-to-center separation (pitch) of 4 micro-meters. Under electron dispersive spectroscopy, the apparent single-phase material in a representative hole is Al, the Al and Sn compositions being 70% Al and 30% Sn, with maximum temperature Tmax being 260° C., according to exemplary embodiments. As shown in FIG. 10, no spherical droplets are formed on the surface of the structure at the 70/30 Al/Sn composition ratio; the Al remains locked in the field matrix.

Figure 11:
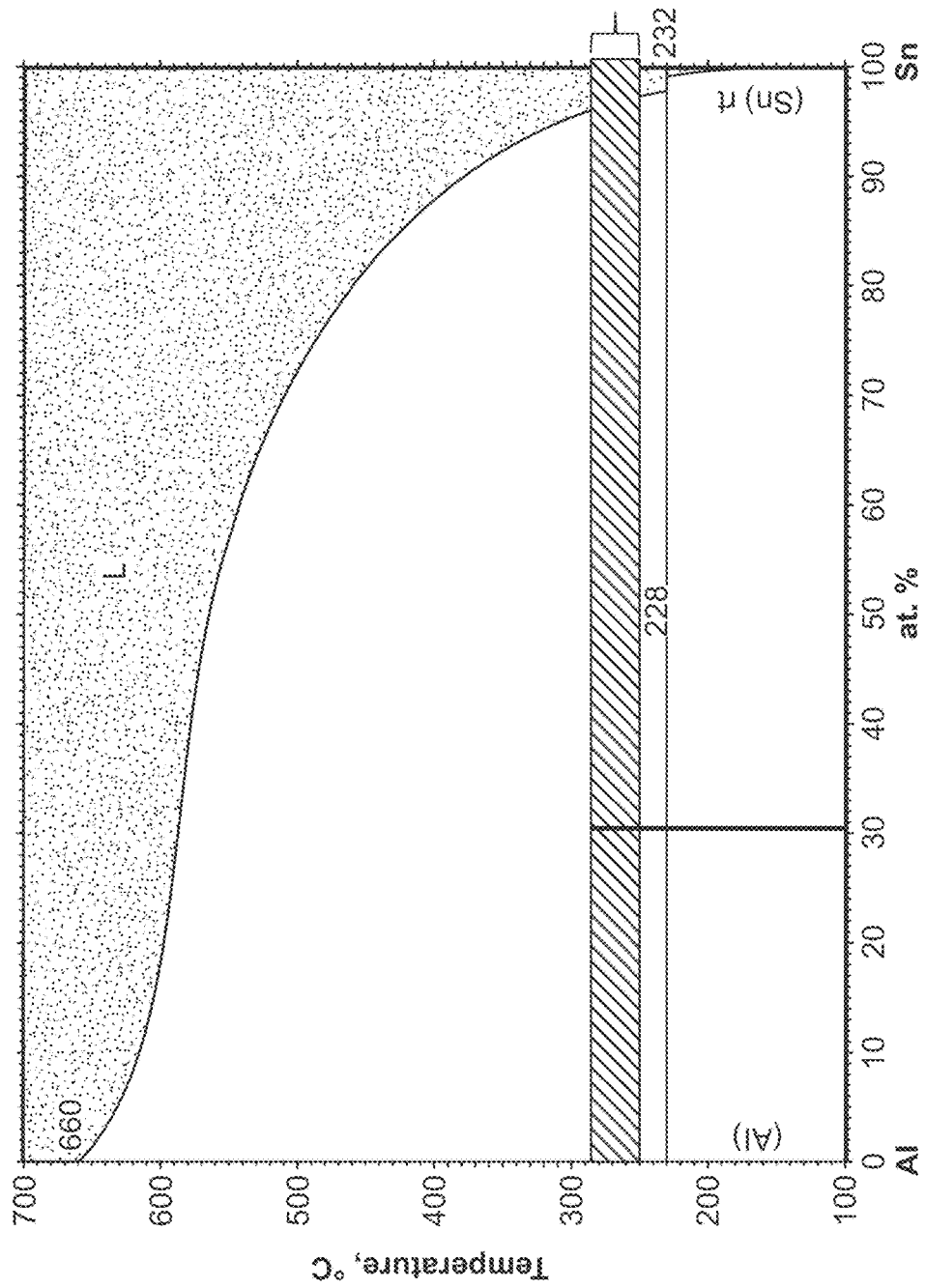
FIG. 11 includes a temperature-composition Al—Sn phase diagram illustrating process temperature and equilibrium phases in the process according to some exemplary embodiments.

FIG. 11 includes a temperature-composition Al—Sn phase diagram illustrating process temperature and equilibrium phases in the process according to some exemplary embodiments. Referring to FIG. 11, in equilibrium at 250° C.<T<280° C., the film stack including 6000 Å Al and 3000 Å Sn, the molar composition of the (Al)+L slurry is close to 70% Al, 30% Sn. The liquid L is 2.4-3.5% Al and 96.5% Sn for 250° C.<T<280° C.

EDS identifies the unmixed phases in the field as pure Al and Sn—Al in an approximate atomic ratio of roughly 44% Sn and 56% Al. Nucleation of an almost pure Al phase is evident within the test vias, most likely as a result of the geometry inside the vias and a free energy advantage for Al nucleation prior to Sn—Al phase solidification.

Figure 12:
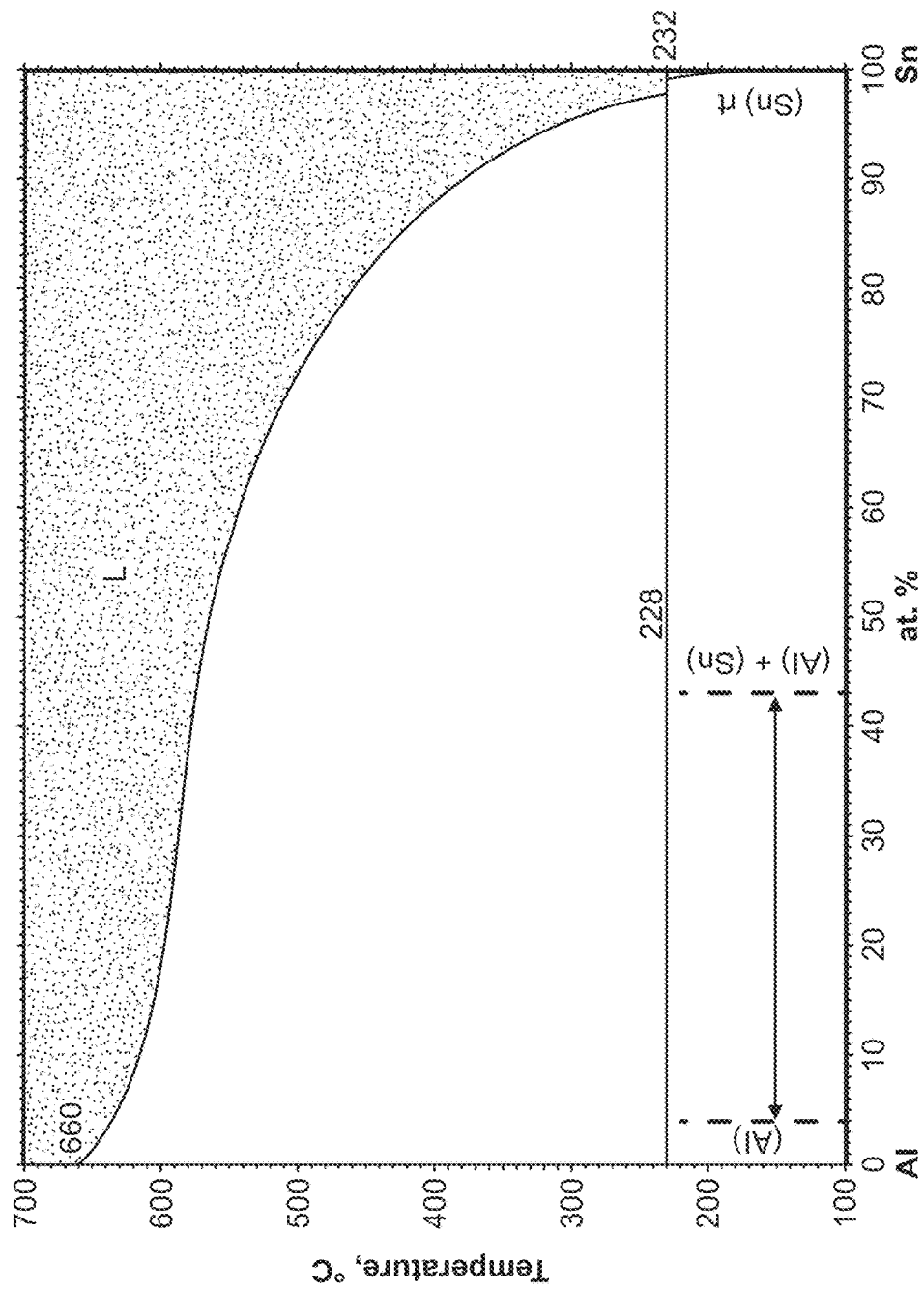
FIG. 12 includes a temperature-composition Al—Sn phase diagram illustrating phase nucleation after solidification in the process according to some exemplary embodiments.

FIG. 12 includes a temperature-composition Al—Sn phase diagram illustrating phase nucleation after solidification in the process according to some exemplary embodiments. Referring to FIG. 12, on cooling, nucleation of Al in the vias consumes about ⅓ of the Al deposited. The remainder nucleates in surface slurry.

Hence, according to the present disclosure, by depositing Sn onto a continuous Al layer at T>232° C., a 2-phase composition with high mobility can be formed. During cooling, the precipitating solid Al preferentially nucleates in vias, and the remaining 2-phase liquid is exuded from within via structures.

The free energy of system (the layer-substrate interface, the fluid, and the layer surface) at compositional equilibrium is reduced by reducing the area of the fluid interface and the area of the fluid surface. SEM data suggests that the former drives precipitation of Al out of the fluid and onto the surfaces of grooves and holes to reduce free energy.

As noted above, according to another embodiment, filling is alternatively accomplished by first depositing a "wetting layer" so that it continuously covers the surface of a substrate, including the surfaces within the grooves and holes. After depositing the wetting layer, a single layer comprising a mixture of eutectic-forming components is deposited on the wetting layer, and during or after depositing said single layer, enough heat energy is provided such that the eutectic temperature between at least two of the components included in said mixture of components is met or exceeded. The ratio of the components in the deposited layer is selected to form a liquid-solid fluid above the eutectic temperature with a suitable level of solid fraction so that the viscosity of the fluid enables filling the grooves and holes.

In some exemplary embodiments, the wetting layer is comprised of a third component known to form a low-energy interface with the intended liquid-solid fluid, thereby preventing de-wetting or "balling up" of the subsequently deposited layer and its two-phase fluid. Upon cooling, the solids in the two-phase fluid precipitate out of the liquid matrix, said precipitation favored thermodynamically onto surfaces within the grooves and holes. Excess material on the substrate surface is removed, for instance by chemical-mechanical polishing (CMP), leaving behind filled grooves and holes.

According to the present disclosure, a eutectic reaction is induced in a layer during or after deposition, providing a liquid-solid fluid layer comprised of eutectic liquid and solids. This is done by heating the layer to a eutectic reflow temperature, defined here as any temperature chosen that is above the eutectic temperature. A eutectic liquid or a fluid comprised of eutectic liquid mixed with solid particles (crystallites) is formed and experiences flow to reduce the free energy of the layer. Thus, the fluid surface layer flows into grooves and holes, filling them.

Whereas many alterations and modifications of the disclosure will become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. A method of forming a pattern of metallic material on a substrate, comprising:
   providing a plurality of void regions on a surface of the substrate, the plurality of void regions defining the pattern;
   at a first temperature, depositing a first layer of a first metallic material of a eutectic-forming pair of metallic materials on the substrate to form a conformal metallic film over the substrate and over the surfaces of the plurality of void regions;
   warming the substrate and conformal metallic film to a second temperature greater than a eutectic-liquid-formation temperature of the eutectic pair of metallic materials;
   at the second temperature, depositing the second metallic material of the eutectic-forming pair of metallic materials on the conformal metallic film to initiate a eutectic-liquid-forming reaction, such that the plurality of void regions are filled with a mixture of the first and second metallic materials of the eutectic-forming pair of metallic materials, the mixture of the first and second metallic materials comprising a low-viscosity eutectic liquid with solid crystallites of the first metallic material in suspension; and
   allowing the mixture to cool at a sufficiently slow rate to cause the solid crystallites to precipitate out of the mixture preferentially onto floors and walls of the void regions and fill them with substantially solid metal.

2. The method of claim 1, wherein one of the first and second metallic materials of the eutectic-forming pair of metallic materials comprises aluminum.

3. The method of claim 2, wherein the other of the first and second metallic materials of the eutectic-forming pair of metallic materials comprises tin.

4. The method of claim 2, wherein the other of the first and second metallic materials of the eutectic-forming pair of metallic materials comprises indium.

5. The method of claim 2, wherein the other of the first and second metallic materials of the eutectic-forming pair of metallic materials comprises bismuth.

6. The method of claim 2, wherein the other of the first and second metallic materials of the eutectic-forming pair of metallic materials comprises gallium.

7. The method of claim 2, wherein the other of the first and second metallic materials of the eutectic-forming pair of metallic materials comprises copper.

8. The method of claim 2, wherein the other of the first and second metallic materials of the eutectic-forming pair of metallic materials comprises lead.

9. The method of claim 2, wherein the other of the first and second metallic materials of the eutectic-forming pair of metallic materials comprises zinc.

10. The method of claim 2, wherein the other of the first and second metallic materials of the eutectic-forming pair of metallic materials comprises silicon.

11. The method of claim 1, wherein one of the first and second metallic materials of the eutectic-forming pair of metallic materials comprises copper.

12. The method of claim 11, wherein the other of the first and second metallic materials of eutectic-forming pair of metallic materials comprises tin.

13. The method of claim 11, wherein the other of the first and second metallic materials of eutectic-forming pair of metallic materials comprises indium.

14. The method of claim 11, wherein the other of the first and second metallic materials of eutectic-forming pair of metallic materials comprises gallium.

15. The method of claim 11, wherein the other of the first and second metallic materials of eutectic-forming pair of metallic materials comprises tellurium.

16. The method of claim 11, wherein the other of the first and second metallic materials of eutectic-forming pair of metallic materials comprises praseodymium.

17. The method of claim 11, wherein the other of the first and second metallic materials of eutectic-forming pair of metallic materials comprises magnesium.

18. The method of claim 1, further comprising depositing a conformal wetting layer on the substrate before depositing the first layer of the first metallic material of the eutectic-forming pair of metallic materials on the substrate.

19. The method of claim 18, wherein the conformal wetting layer is formed of a material which includes one of the first and second metallic materials of the eutectic-forming pair of metallic materials.

20. The method of claim 18, wherein the conformal wetting layer is formed of a material which is not one of the first and second metallic materials of the eutectic-forming pair of metallic materials.

21. The method of claim 1, wherein the second metallic material is deposited on the conformal metallic film simultaneously with warming the substrate and conformal metallic film to the second temperature.

22. A method of forming a pattern of metallic material on a substrate, comprising:
    providing a plurality of void regions on a surface of the substrate, the plurality of void regions defining the pattern;
    at a first temperature, depositing a first layer of one or more metallic materials of a group of eutectic-forming metallic materials on the substrate to form a conformal metallic film over the substrate and on surfaces of the plurality of void regions;
    warming the substrate and conformal metallic film to a second temperature greater than a eutectic-liquid-formation temperature of the group of eutectic-forming metallic materials;
    at the second temperature, depositing other metallic materials of the group of eutectic-forming metallic materials on the conformal metallic film to initiate a eutectic-liquid-forming reaction, such that a eutectic liquid surface is formed and flows into the plurality of void regions, the eutectic liquid surface comprising a mixture of at least one of the other metallic materials in a liquid state and solid crystallites of the one or more metallic materials of the first layer in suspension; and
    allowing the mixture to cool at a sufficiently slow rate to cause the solid crystallites to precipitate out of the mixture preferentially onto floors and walls of the void regions and fill them with substantially solid metal.

23. The method of claim 22, wherein the conformal metallic film comprises an alloy formed from two or more metallic materials selected from the group of eutectic-forming metallic materials.

24. The method of claim 23, wherein the eutectic liquid surface comprises an alloy formed from two or more metallic materials selected from the group of eutectic-forming metallic materials.

25. The method of claim 22, wherein the other metallic materials are deposited on the conformal metallic film simultaneously with warming the substrate and conformal metallic film to the second temperature.

\* \* \* \* \*